United States Patent [19]

Matsumoto

[11] Patent Number: 4,597,013
[45] Date of Patent: Jun. 24, 1986

[54] SOLID STATE IMAGE SENSOR

[75] Inventor: Hiroyuki Matsumoto, Atsugi, Japan

[73] Assignee: Sony Corporation, Tokyo, Japan

[21] Appl. No.: 521,969

[22] Filed: Aug. 10, 1983

[30] Foreign Application Priority Data

Aug. 11, 1982 [JP] Japan ................................. 57-139341

[51] Int. Cl.[4] .............................................. H04N 5/30
[52] U.S. Cl. ...................................... 358/213; 358/41; 357/24
[58] Field of Search ................... 358/209, 212, 213, 41; 250/578, 204; 357/24 LR, 30

[56] References Cited

U.S. PATENT DOCUMENTS

| | | | |
|---|---|---|---|
| 3,942,022 | 3/1976 | Stumpf et al. | 250/578 |
| 4,320,413 | 3/1982 | Takemura | 358/44 |
| 4,338,633 | 7/1982 | Malm | 358/213 |
| 4,339,775 | 7/1982 | Lemke et al. | 360/10 |
| 4,366,503 | 12/1982 | Terakawa et al. | 358/213 |
| 4,380,755 | 4/1983 | Endlicher et al. | 382/68 |
| 4,447,735 | 5/1984 | Horii | 250/578 |
| 4,472,744 | 9/1984 | Inoue et al. | 358/293 |
| 4,495,523 | 1/1985 | Ozawa | 358/293 |
| 4,496,980 | 1/1985 | Pfleiderer et al. | 358/212 |

FOREIGN PATENT DOCUMENTS

| | | | |
|---|---|---|---|
| 56-51170 | 5/1981 | Japan | 358/213 |
| 57-45271 | 3/1982 | Japan | 357/24 LR |

Primary Examiner—Gene Z. Rubinson
Assistant Examiner—Robert G. Lev
Attorney, Agent, or Firm—Hill, Van Santen, Steadman & Simpson

[57] ABSTRACT

A solid state image sensor is disclosed which includes a photosensitive region consisting of a group of first vertical shift registers formed of a plurality of charge transfer devices, photoelectric converting sections electrically separated from one other by a channel stop section between adjacent ones of the first vertical shift registers and capable of accumulating a signal charge and devices transferring the signal charge of the photoelectric converting sections to corresponding one of the first vertical shift registers, a storage section consisting of a group of second vertical shift registers electrically connected to one ends of the first vertical shift registers, respectively, a charge transfer horizontal shift register electrically connected to one ends of the second vertical shift registers, a section for transferring undesired charges within the first vertical shift registers during a vertical blanking period after a light receiving period, a section for transferring the signal charge from the photoelectric converting sections to the first vertical shift registers, and a section for transferring a remaining charge determined by the signal charge again from the photoelectric converting sections to the first vertical shift registers after the signal charge is transferred from the first vertical shift registers to the second vertical shift register groups.

3 Claims, 14 Drawing Figures

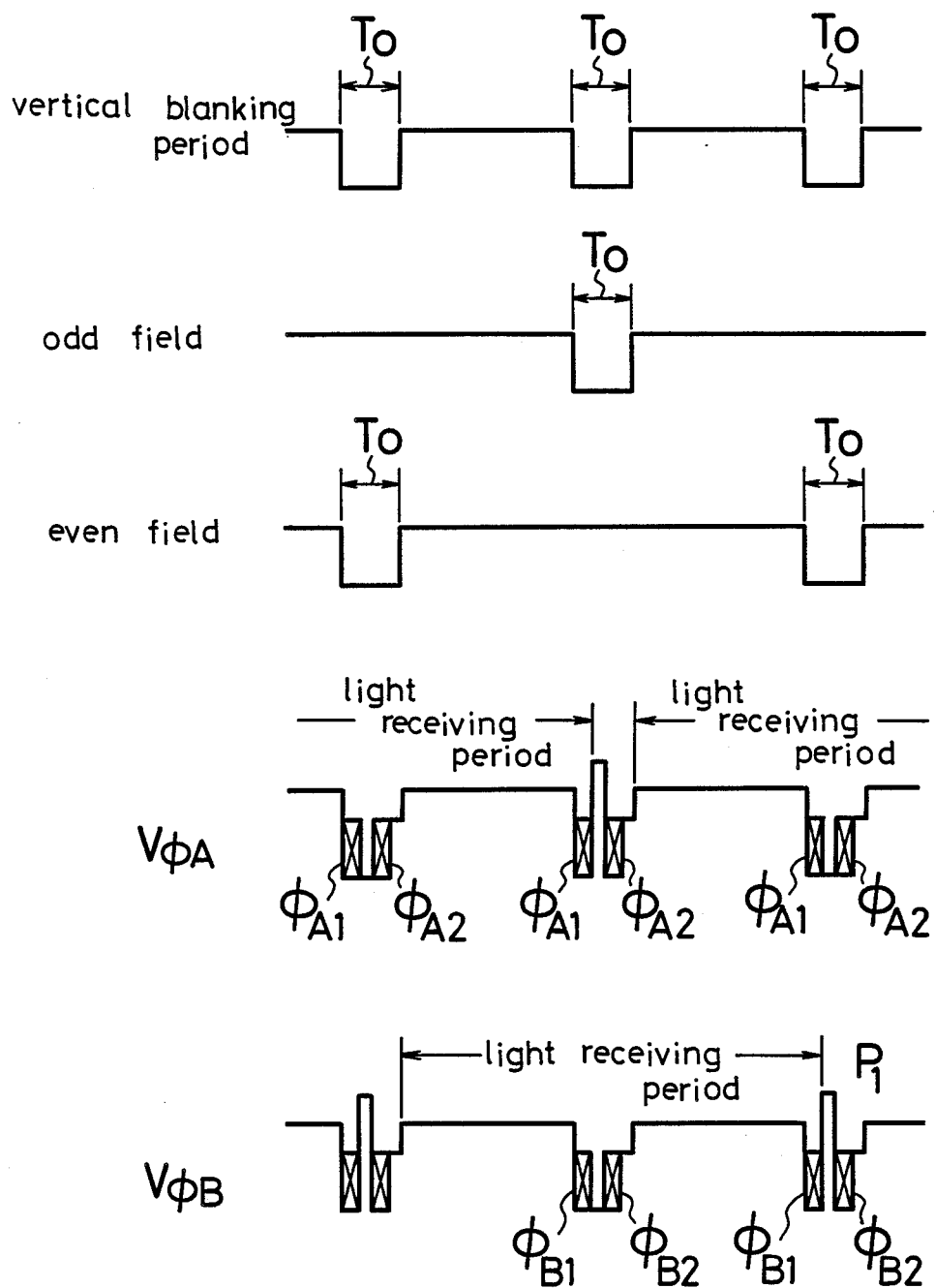

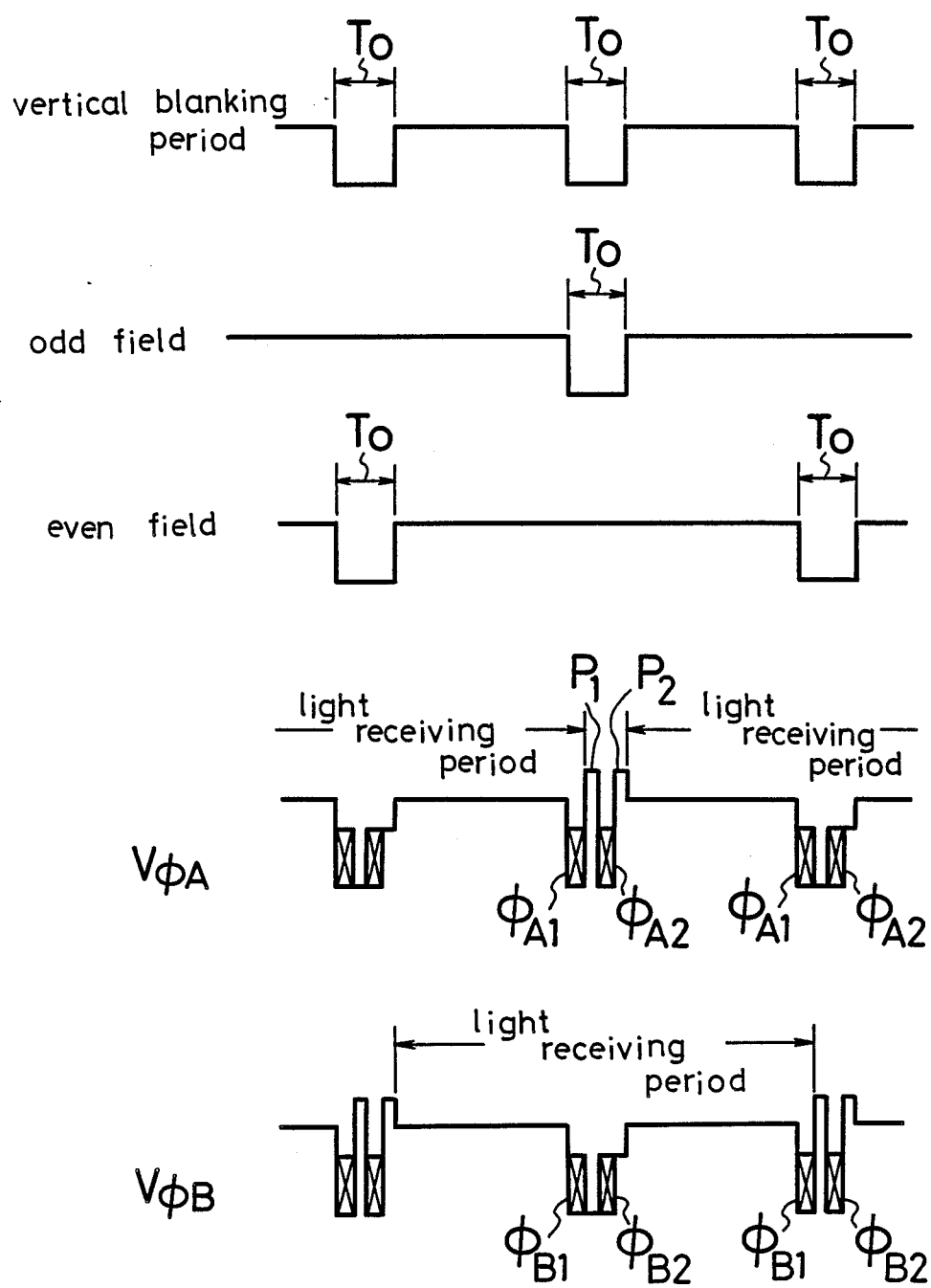

FIG. 5
$V\phi$ — 1 frame — vertical blanking period
$P_1$, $P_2$, $\phi_{A1}(\phi_{B1})$, $\phi_{A2}(\phi_{B2})$
periods $T_A$ $T_B$ $T_C$ $T_D$ $T_E$ $T_F(T_A)$
FIG. 5-A
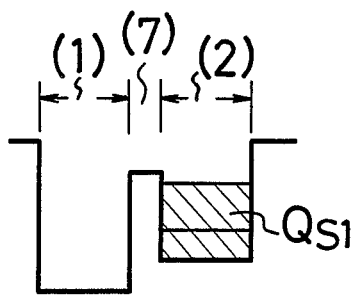
(1) (7) (2), $Q_{S1}$
FIG. 5-B
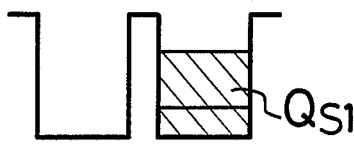
$Q_{S1}$
FIG. 5-C
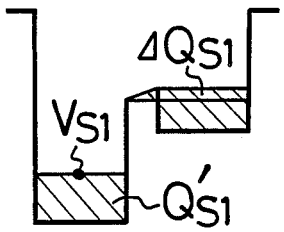
$V_{S1}$, $\Delta Q_{S1}$, $Q'_{S1}$
FIG. 5-D
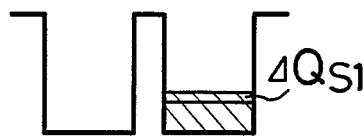
$\Delta Q_{S1}$
FIG. 5-E
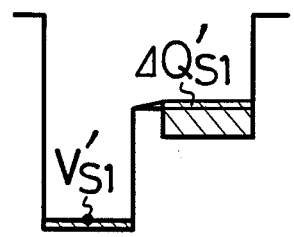
$V'_{S1}$, $\Delta Q'_{S1}$
FIG. 5-F
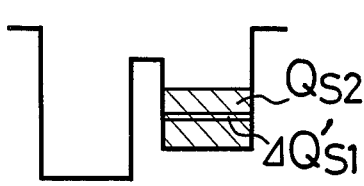
$Q_{S2}$, $\Delta Q'_{S1}$

SOLID STATE IMAGE SENSOR

BACKGROUND OF THE INVENTION

1. Field of the Invention

The present invention generally relates to a solid state image sensor and more particularly is directed to a solid state image sensor in which even when a PN junction type sensor is employed as a light receiving section thereof, an afterimage or residual image can be reduced as much as possible.

2. Description of the Prior Art

It is known in the art that when a solid state image sensor employs a PN junction sensor having good sensitivity for short wavelength as its light receiving section, an afterimage or residual image is generated therein and hence the characteristics as the solid state image sensor is deteriorated. In order to prevent the residual image from being generated in the solid state image sensor employing the PN junction sensor, such a method is known that the sensor region is completely depleted and then a read out is performed. However, depleting the nearby surface of the sensor region causes a dark current to be increased due to Si-SiO$_2$ interface level and this nearby surface to be easily affected by a floating charge in and above the oxide film, thereby giving rise to poor reliability. Moreover, in order to suppress the influence of the floating charge, it has been proposed to fulfil the shallow surface area of the sensor region with holes (in the case of N channel) to thereby stabilize the solid state image sensor. In this case, a serious consideration must be made on the fact that the sensitivity for the short wavelength is lowered.

In the previously proposed solid state image sensor, one of the reasons why the residual image is generated when the PN junction type sensor is used as its light receiving section may be considered by a so-called short channel modulation when the channel length of a read-out gate section is short (less than 2 to 3μm). The mechanism under which the residual image is caused when the channel length of the read-out gate section is short will hereinafter be described. First, the outline of the previously proposed solid state image sensor will be described with reference to the drawings.

As shown in FIG. 1, the solid state image sensor consists of a photosensitive region 3 which includes a group of plural vertical shift registers 1 formed of a charge transfer device, for example, CCD (charge coupled device) and photoelectric converting sections, which are located between the adjacent vertical shift registers 1 and capable of accumulating charges, namely, light receiving sections 2, each being corresponding to each picture element, a storage section 5 having a group of vertical shift registers 4 similarly formed of a CCD, each of which is electrically connected to one end of each vertical shift register 1 in the photosensitive region 3, and a horizontal shift register 6 formed similarly of a CCD and which is connected to the storage section 5. In the photosensitive region 3, a read-out gate section 7 is formed on one side of each light receiving section 2, namely, the side of the corresponding vertical shift register 1 to transfer a signal charge from the light receiving section 2 to the vertical shift register 1, while an overflow drain region 9 is formed on the other side of each light receiving section 2 through an overflow control gate section 8. A channel stop region 10 is formed so as to separate each vertical line and each light receiving section 2. Other portions than the light receiving section 2 are all shielded or masked from a light.

FIG. 2A (corresponding to a cross-sectional diagram taken along a line A—A in FIG. 1) shows an example of a practical structure of the portion through which the signal charge of the light receiving section 2 is transferred to the vertical shift register 1. In this embodiment, an N+ type region 12 is formed on the major surface of a, for example, P type semiconductor substrate 11 to form the light receiving section 2 of a PN junction type. An N type region 13 is formed on the substrate 11 adjacent to the light receiving section 2 to thereby provide the vertical shift register 1 of a so-called buried channel type. Onto the vertical shift register 1 is deposited a transfer electrode 15 of, for example, two-phase drive type through an insulated layer 14 formed on the substrate 11. The transfer electrode 15 is extended over the read-out gate section 7 between the light receiving section 2 and the vertical shift register 1. The overflow control gate section 8 adjacent to the other side of the light receiving section 2 is constructed such that a control gate electrode 16 is deposited through the insulated film 14 onto the substrate 11. The overflow drain region 9 formed of an N+ type region 17 is formed to adjoin the overflow control gate section 8. The channel stop region 10 is formed of P+ type region.

In such solid state image sensor, a signal charge accumulated in the light receiving section 2 during the light receiving period is transferred to the vertical shift register 1 from the light receiving section 2 during the vertical blanking period, and then transferred therefrom to the storage section 5 at higher speed and then stored therein temporarily. Thereafter, the signal charge of one horizontal line each is transferred from the storage section 5 to the horizontal shift register 6 at each horizontal scanning period and then the signal charge is read out sequentially from the output terminal by one picture element amount each. According to this solid state image sensor, the signal charge produced in the light receiving section 2 is transferred to the light-shielded vertical shift register 1, the signal charge is then transferred from the vertical shift register 1 to the storage section 5 at high speed and the signal charge stored temporarily in the storage section 5 is outputted through the horizontal shift register 6 at each horizontal line amount. Thus, such an advantage is effected that a picture quality can be prevented from being deteriorated by a so-called smear. A conventional drive method of such solid state image sensor is as follows. As shown in a timing chart of FIG. 3, after the light having been received, the vertical shift register 1 is driven by transfer clock signals $\phi_{A1}$ and $\phi_{B1}$ during the first period of the corresponding vertical blanking period T$_0$ in the odd or even field to be read out to thereby perform a so-called discharge-transfer of undesired charge in the vertical shift register 1. Then, a read pulse P$_1$ is applied to one of the transfer electrodes for the vertical shift register 1 to open the read-out gate section 7 to thereby transfer the signal charge from the light receiving section 2 to the vertical shift register 1. Subsequently, transfer clock signals $\phi_{A2}$ and $\phi_{B2}$ are applied to the vertical shift register 1 to transfer the signal charge from the vertical shift register 1 to the storage section 5, and then the solid state image sensor enters into the light receiving period.

The mechanism of how the residual image is produced in such solid state image sensor will be described below. When the light receiving section 2 is formed of PN junction type, as shown in FIG. 2B, as the reference potential of the light receiving section 2, the surface potential $\phi_S$ of the read-out gate section 7 upon reading out the signal charge in the preceding frame becomes a reference potential when a signal charge $Q_{sig}$ of the next frame is accumulated, so that the reset potential of the light receiving section 2 must always be made constant. In FIG. 2B, reference numeral 21 denotes a potential when the charge is transferred from the vertical shift register 1 to the storage section 5 and reference numeral 22 denotes a potential when the charge is read out from the light receiving section 2 into the vertical shift register 1. However, as shown in FIG. 2C (which diagram shows the potential when the signal charge is read out from the light receiving section 2 to the vertical shift register 1), the surface potential of the read-out gate section 7 is modulated by the potential of the vertical shift register 1 as the channel length 1 of the read-out gate section 7 becomes short. In other words, since the potential of the vertical shift register 1 is determined by the signal charge of the preceding frame and the surface potential of the read-out gate section 7 is modulated by the potential of the vertical shift register 1 to thereby determine the reference potential of the light receiving section 2 in the subsequent frame, the signal charge amount of the subsequent frame is affected by the preceding frame to appear as the residual image. In FIG. 2C, if, for example, a signal charge $Q_{S(n-2)}$ of (n−2)−th frame is equal to 0, the potential of the vertical shift register 1 thereof is taken as $V_D$ and the surface potential of the read-out gate section 7 thereof is taken as $\phi_S$, a reference potential of the light receiving portion 2 in the subsequent (n−1)−th frame is determined by the surface potential $\phi_S$. When the signal charge $Q_{S(n-1)} = Q_S$ of this (n−1)−th frame is transferred to the vertical shift register 1 and its potential becomes equal to $V_D'$, the surface potential of the read-out gate section 7 is modulated from $\phi_S$ to $\phi_S'$ by this potential $V_D'$, leaving a part of the charge of the (n−1)−th frame corresponding to $\Delta \phi_S$ in the light receiving section 2. Accordingly, since the surface potential $\phi_S'$ of the read-out gate section 7 becomes the reference potential of the light receiving section 2 in the following n-th frame, the remaining charge corresponding to the $\Delta \phi_S$ pertains the generation of the residual image.

OBJECTS AND SUMMARY OF THE INVENTION

Accordingly, it is an object of the present invention to provide a solid state image sensor which can obviate the afore-said defects inherent in the conventional solid state image sensor.

It is another object of the present invention to provide an improved solid state image sensor, by which even when a PN junction type sensor is employed, a residual image can be reduced as much as possible.

According to one aspect of the present invention, there is provided a solid state image sensor comprising:
a photosensitive region consisting of a group of first vertical shift registers formed of a plurality of charge transfer devices, photoelectric converting sections electrically separated from one other by channel stop means between adjacent ones of said first vertical shift registers and capable of accumulating a signal charge and devices transferring the signal charge of said photoelectric converting sections to corresponding one of said first vertical shift registers; a storage section consisting of a group of second vertical shift registers electrically connected to one ends of said first vertical shift registers, respectively;
a charge transfer horizontal shift register electrically connected to one ends of said second vertical shift registers;
means for transferring undesired charges within said first vertical shift registers during a vertical blanking period after a light receiving period;
means for transferring the signal charge from said photoelectric converting sections to said first vertical shift registers; and
means for transferring a remaining charge determined by said signal charge again from said photoelectric converting sections to said first vertical shift registers after the signal charge is transferred from said first vertical shift registers to said second vertical shift register groups.

The other objects, features and advantages of the present invention will become apparent from the following description taken in conjunction with the accompanying drawings through which the like references designate the same elements and parts.

BRIEF DESCRIPTION OF THE DRAWINGS

FIG. 3 is a timing chart showing a conventional drive method of the solid state image sensor;

FIG. 4 is a timing chart showing a drive method used in the solid state image sensor according to the present invention;

FIG. 5 (including FIGS. 5-A to 5-F) is a diagram used to explain the theory of reducing a residual image.

DESCRIPTION OF THE PREFERRED EMBODIMENT

Now, an embodiment of a solid state image sensor according to the present invention will be described hereinafter.

Figure 1:
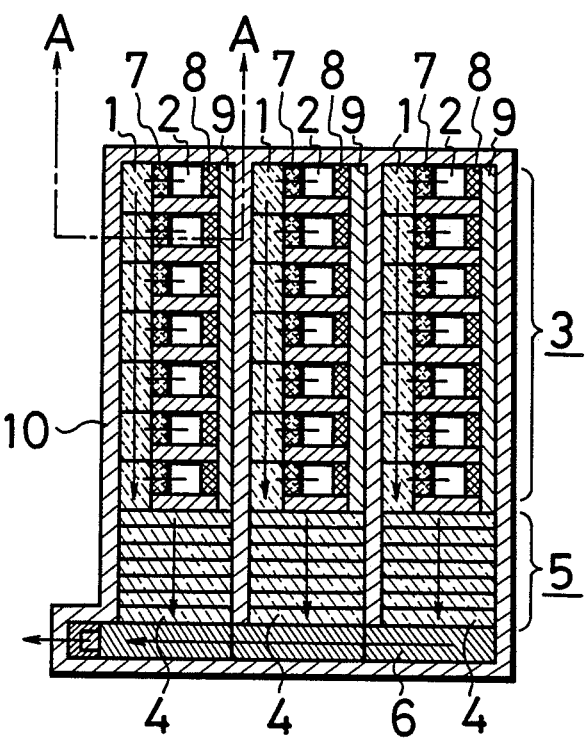
FIG. 1 is a plan diagram showing an outline of a solid state image sensor used to explain the present invention.
Figure 2A:
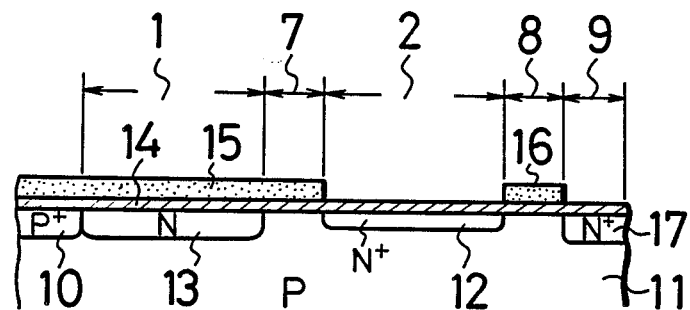
FIG. 2A is a cross-sectional diagram taken along the line A—A of the solid state image sensor in FIG. 1.
Figure 2B:
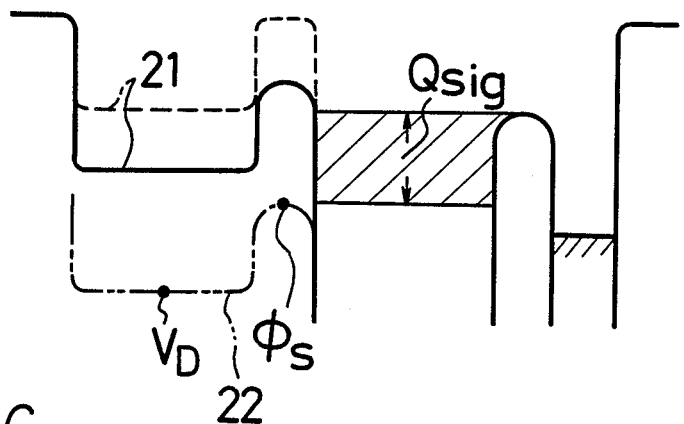
FIGS. 2B and 2C are respectively potential diagrams used to explain the mechanism of how a residual image occurs.
Figure 2C:
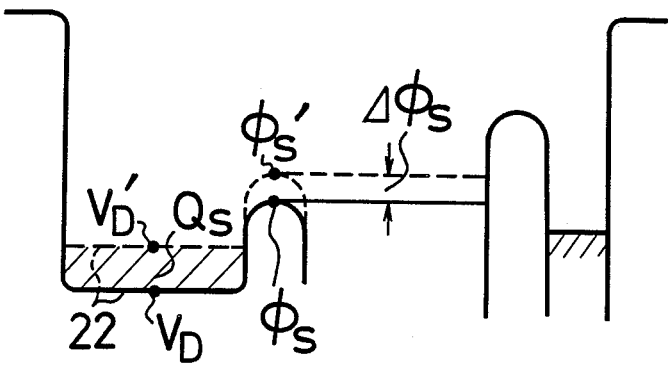

In the same way as in FIG. 1, the solid state image sensor of the present invention comprises the photosensitive section 3, which includes a group of vertical shift registers 1 in plural rows formed of a CCD, photoelectric converting sections, namely, a plurality of light receiving sections 2 which are separated by the channel stop region 10 between adjacent shift registers 1 and capable of accumulating a signal charge, read-out gate sections 7, each of which transfers the signal charge accumulated in the light receiving section 2 to the vertical shift register 1, overflow control gate sections 8 and overflow drain regions 9, a storage section 5 consisting of a group of vertical shift registers 4 formed of a CCD and connected electrically to one end of each vertical shift register 1 in the photosensitive region 3, and a horizontal shift register 6 formed of a CCD and connected to the storage section 5 to read out the signal charge therefrom. In this case, an example of the practical construction of the section which transfers the signal charge accumulated in the light receiving section 2 to the vertical shift register 1 is made to be the same as that shown in FIG. 2A, and particularly in this case, the light receiving section 2 is formed of PN junction type.

In the solid state image sensor according to the present invention thus made, there are provided such means that during the vertical blanking period, the undesired charge accumulated in the vertical shift register 1 in the photosensitive region 3 is discharge-transferred, the signal charge is transferred from the light receiving section 2 to the vertical shift register 1 and this signal charge is transferred from the vertical shift register 1 to the storage section 5 and that thereafter the remaining charge in the light receiving section 2 which is determined by the afore-described signal charge is transferred again from the light receiving section 2 to the vertical shift register 1 to thereby reduce the residual image as much as possible. FIG. 4 is a timing chart thereof, while FIG. 5 is a diagram showing the theory thereof. In this case, the timing period of a clock voltage $V_\phi$ is divided into $T_A$ to $T_F$ indicating the states of the potentials and signal charges of the vertical shift register 1, the read-out gate section 7 and the light receiving section 2 during the respective periods. On the figures, reference letter $T_0$ each represents the vertical blanking period corresponding to odd field or even field, and $V_\phi$ ($V_{\phi A}$ and $V_{\phi B}$) a clock voltage (two-phase drive clock voltage) supplied to the transfer electrodes 15 of the vertical shift register 1.

As shown in FIGS. 4 and 5, during the light receiving period $T_A$ of a certain frame, a signal charge of $Q_{S1}$ is accumulated in the light receiving section 2 (see FIG. 5-A). After this light receiving period $T_A$, during the first period $T_B$ (this period $T_B$ is also substantially included in the period $T_B$) within the corresponding vertical blanking period $T_0$ to the field to be read out, the vertical shift register 1 is driven by the transfer clock signals $\phi_{A1}$ and $\phi_{B1}$ so that, as shown in FIG. 5-B, the undesired charge within the vertical shift register 1 is first transferred from, for example, the vertical shift register 1 to the storage section 5 and then from the storage section 5 to the horizontal shift register 6 and thereby discharged.

During the subsequent period $T_C$ after the discharge-transfer of the undesired charge, the read pulse $P_1$ is applied to one of the transfer electrodes of the vertical shift register 1 to open the read-out gate section 7 whereby, as shown in FIG. 5-C, a signal charge $Q_{S1}'$ is transferred from the light receiving section 2 to the vertical shift register 1. The potential $V_{S1}$ of the vertical shift register 1 set by the transferred signal charge $Q_{S1}'$ modulates the surface potential of the read-out gate section 7, leaving a charge $\Delta Q_{S1}(=Q_{S1}-Q_{S1}')$ in the light receiving section 2.

During the next period $T_D$, the transfer clock signals $\phi_{A2}$ and $\phi_{B2}$ are applied to the vertical shift register 1 to thereby transfer the signal charge $Q_{S1}'$ from the vertical shift register 1 to the storage section 5.

After the signal charge $Q_{S1}'$ was transferred to the storage section 5, during the period $T_E$, the read pulse $P_2$ is again applied to the above one transfer electrode of the shift register 1 to open the read-out gate section 7 as shown in FIG. 5-E, so that the charge left in the light receiving section 2 is transferred to the vertical shift register 1. At that time, the signal charge modulated in channel by the potential $V_{S1}'$ of the vertical shift register 1 is read out and hence the charge amount remaining in the light receiving section 2 is expressed as $\Delta Q_{S1}'$, which then becomes the residual image. In this case, however, since $\Delta Q_{S1} > \Delta Q_{S1}'$, the residual image is reduced greatly. Thereafter, during the light receiving period $T_F$, as shown in FIG. 5-F, the signal charge $Q_{S2}$ of the next frame is accumulated and the same operation as above will be performed repeatedly thereafter.

Figure 6:
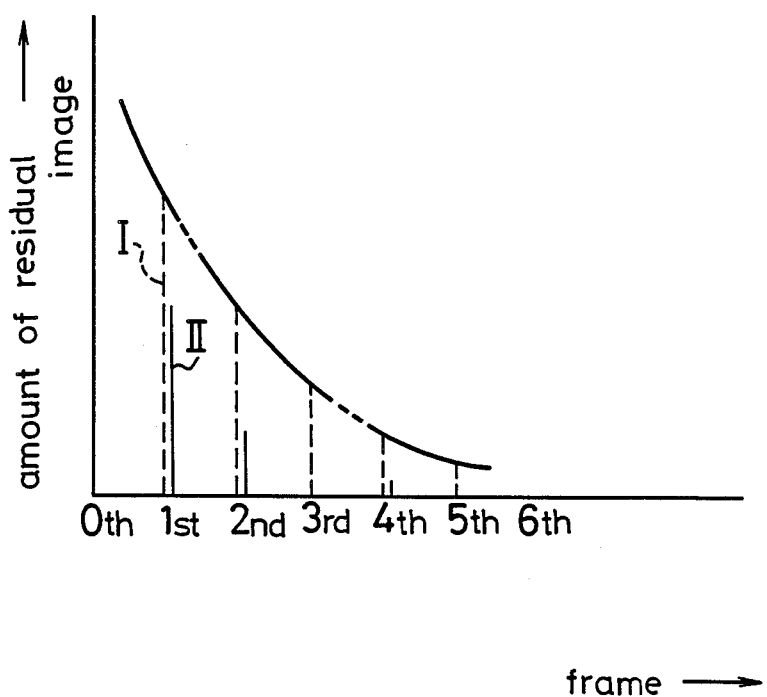
FIG. 6 is a graph showing compared results of the residual image amounts in the solid state image sensors according to the prior art and the present invention.

FIG. 6 is a graph showing the state in which the residual image is decreased in the solid state image sensor of this invention. In the figure, a broken line I indicates a residual image occurred in the solid state image sensor according to the prior art and a solid line II indicates that of the solid state image sensor according to the present invention. While the residual image in the conventional solid state image sensor decreases exponentially as in the first frame, the second frame, . . . , the residual image in the solid state image sensor according to the present invention can substantially be considered same as that to be read out twice so that the residual image amount of the second frame in the prior art appears in the first frame and the residual image amount of the fourth frame in the prior art appears in the second frame, thus apparently the residual image being reduced greatly.

As set forth above, according to the present invention, since after the signal charge accumulated in the light receiving section is transferred to the storage section by the vertical shift register, before the light receiving period, the read-out gate section is again opened to thereby transfer the remaining charge therein to the vertical shift register, the substantial remaining charge amount in the light receiving section is extremely reduced. In consequence, even when the PN junction type sensor of good sensitivity is employed as the light receiving section, the residual image can be reduced as much as possible.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

I claim:

1. A solid state image sensor comprising: a photosensitive region consisting of a group of first vertical shift registers formed of a plurality of charge transfer devices, photoelectric converting sectitons electrically separated from each other by channel stop means between adjacent ones of said first vertical shift registers and capable of accumulating a signal charge and devices transferring the signal charge of said photoelectric converting sections to corresponding one of said first vertical shift registers; a storage section consisting of a group of second verticl shift registers electrically connected to one ends of said first vertical shift registers, respectively; a charge transfer horizontal shift register electrically connected to one ends of said second vertical shift registers; first means for transferring undesired charges within said first vertical shift registers, second means for transferring the signal charge from said photoelectric converting sections to said first vertical shift registers; third means for transferring the signal charge from said first vertical shift registers to said second vertical shift register groups; and said second means for transferring operating a second time within a vertical blanking period after a light receiving period to transferring a remaining charge resulting from said signal charge in said photoelectric converting sections to said first verticl shift registers during in which said signal charges are read into said first vertical shift registers said vertical blanking period.

2. A solid state image sensor according to claim 1, wherein said photoelectric converting sections are formed of a PN junction type sensor.

3. A solid state image sensor according to claim 1, wherein the signal charge of said second vertical shift registers is read out through said horizontal shift register.

* * * * *